(12) United States Patent
Mazzochette et al.

(10) Patent No.: US 7,964,883 B2
(45) Date of Patent: Jun. 21, 2011

(54) LIGHT EMITTING DIODE PACKAGE ASSEMBLY THAT EMULATES THE LIGHT PATTERN PRODUCED BY AN INCANDESCENT FILAMENT BULB

(75) Inventors: Joseph Mazzochette, Cherry Hill, NJ (US); Edmar Amaya, King of Prussia, PA (US); Lin Li, Mount Laurel, NJ (US); Greg E. Blonder, Summit, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 0 days.

(21) Appl. No.: 10/788,116

(22) Filed: Feb. 26, 2004

(65) Prior Publication Data
US 2005/0189557 A1    Sep. 1, 2005

(51) Int. Cl.
*H01L 33/00* (2010.01)
(52) U.S. Cl. ............... 257/98; 257/88; 257/93; 257/99; 257/100
(58) Field of Classification Search ............ 362/231; 257/100, 88, 93, 98, 99, 712; 428/552
See application file for complete search history.

(56) References Cited

U.S. PATENT DOCUMENTS

| | | | |
|---|---|---|---|
| 3,711,789 A | 1/1973 | Dierschke | |
| 4,271,408 A * | 6/1981 | Teshima et al. | 345/83 |
| 4,798,435 A * | 1/1989 | Fujiwara et al. | 385/17 |
| 4,886,709 A * | 12/1989 | Sasame et al. | 428/552 |
| 4,935,655 A | 6/1990 | Ebner | |
| 4,935,665 A | 6/1990 | Murata | |
| 4,963,414 A | 10/1990 | LeVasseur et al. | |
| 5,117,281 A | 5/1992 | Katsuraoka | 357/81 |
| 5,122,781 A | 6/1992 | Saubolle | 340/473 |
| 5,140,220 A | 8/1992 | Hasegawa | 313/512 |
| 5,221,819 A | 6/1993 | Schroettle et al. | |
| 5,482,898 A | 1/1996 | Marrs | 437/216 |
| 5,485,037 A | 1/1996 | Marrs | 257/712 |
| 5,581,876 A | 12/1996 | Prabhu et al. | 29/851 |
| 5,623,181 A * | 4/1997 | Suehiro et al. | 313/512 |
| 5,660,461 A | 8/1997 | Ignatius et al. | |
| 5,725,808 A | 3/1998 | Tormey et al. | 252/514 |
| 5,745,624 A | 4/1998 | Chan et al. | 385/91 |

(Continued)

FOREIGN PATENT DOCUMENTS

JP    2000-294701    * 10/2000    ............... 257/712

*Primary Examiner* — Ori Nadav
(74) *Attorney, Agent, or Firm* — Cantor Colburn LLP

(57) ABSTRACT

In accordance with the invention, a light emitting diode package assembly is provided to emulate the pattern of light produced by an incandescent filament bulb. The package assembly is composed of a substrate for LEDs comprising a heat-sinking base having a pair of opposing major surfaces. Each major surface has an overlying of thermally conducting ceramic and an outer surface layer of light reflective material. Disposed on each surface layer is a plurality of LEDs. Advantageously, the LEDs are arranged on the surface in a configuration of low mutual obstruction. Advantageously, reflecting elements transverse to each surface layer are positioned and shaped to reflect a substantial portion of the light emitted from the LEDs that would otherwise enter neighboring LEDs. In a preferred embodiment, the LEDs are arranged in the general form of a closed curve, and a transverse reflector is disposed in the interior of the curve. Alternatively, the LEDs can be arranged in a linear array. The assembly can be efficiently fabricated by back-to-back assembly of two similar subassemblies.

25 Claims, 7 Drawing Sheets

U.S. PATENT DOCUMENTS

| | | | |
|---|---|---|---|
| 5,754,403 A * | 5/1998 | Ozmat et al. | 361/720 |
| 5,841,244 A | 11/1998 | Hamilton et al. | |
| 5,847,935 A | 12/1998 | Thaler et al. | 361/761 |
| 5,857,767 A | 1/1999 | Hochstein | 362/294 |
| 5,953,203 A | 9/1999 | Tormey et al. | 361/313 |
| 5,977,567 A | 11/1999 | Verdiell | 257/99 |
| 6,016,038 A | 1/2000 | Mueller et al. | |
| 6,045,240 A | 4/2000 | Hochstein | 362/294 |
| 6,220,722 B1 * | 4/2001 | Begemann | 362/231 |
| 6,259,846 B1 | 7/2001 | Roach et al. | |
| 6,318,886 B1 | 11/2001 | Stopa et al. | |
| 6,325,524 B1 * | 12/2001 | Weber et al. | 362/245 |
| 6,376,268 B1 | 4/2002 | Verdiell | 438/26 |
| 6,428,189 B1 * | 8/2002 | Hochstein | 362/373 |
| 6,455,930 B1 | 9/2002 | Palanisamy et al. | 257/706 |
| 6,480,389 B1 | 11/2002 | Shie et al. | 361/707 |
| 6,483,623 B1 | 11/2002 | Maruyama | 359/180 |
| 6,518,502 B2 | 2/2003 | Hammond et al. | 174/52.4 |
| 6,550,953 B1 * | 4/2003 | Ichikawa et al. | 315/56 |
| 6,634,750 B2 | 10/2003 | Neal et al. | 351/211 |
| 6,634,770 B2 | 10/2003 | Cao | 362/294 |
| 6,670,751 B2 | 12/2003 | Song et al. | |
| 6,692,252 B2 | 2/2004 | Scott | 433/29 |
| 6,727,643 B2 * | 4/2004 | Suehiro | 313/499 |
| 6,780,296 B1 | 8/2004 | Bhullar et al. | |
| 6,793,374 B2 | 9/2004 | Begemann | |
| 6,860,621 B2 * | 3/2005 | Bachl et al. | 362/373 |
| 6,876,149 B2 * | 4/2005 | Miyashita | 313/512 |
| 6,936,855 B1 * | 8/2005 | Harrah | 257/88 |
| 6,955,451 B2 | 10/2005 | Coushaine et al. | |
| 6,984,852 B2 * | 1/2006 | Wang et al. | 257/99 |
| 7,008,095 B2 | 3/2006 | Coushaine et al. | |
| 7,030,423 B2 * | 4/2006 | Chang et al. | 257/98 |
| 7,049,746 B2 * | 5/2006 | Mano et al. | 313/512 |
| 7,121,687 B2 | 10/2006 | Sidwell et al. | |
| 7,207,695 B2 | 4/2007 | Coushaine et al. | |
| 2001/0030866 A1 * | 10/2001 | Hochstein | 362/294 |
| 2001/0032985 A1 | 10/2001 | Bhat et al. | |
| 2002/0004251 A1 | 1/2002 | Roberts et al. | 438/26 |
| 2002/0034834 A1 | 3/2002 | Verdiell | 438/22 |
| 2002/0163006 A1 | 11/2002 | Yoganandan et al. | 257/81 |
| 2002/0175621 A1 | 11/2002 | Song et al. | 313/515 |
| 2002/0176250 A1 | 11/2002 | Bohler et al. | 362/236 |
| 2003/0010993 A1 | 1/2003 | Nakamura et al. | |
| 2003/0025465 A1 | 2/2003 | Swanson et al. | |
| 2003/0057421 A1 | 3/2003 | Chen | 257/79 |
| 2004/0026706 A1 | 2/2004 | Bogner et al. | 257/99 |
| 2004/0150995 A1 | 8/2004 | Coushaine et al. | |
| 2004/0222433 A1 | 11/2004 | Mazzochette et al. | 257/99 |
| 2004/0233672 A1 | 11/2004 | Dubuc | |
| 2005/0029535 A1 | 2/2005 | Mazzochette et al. | |
| 2005/0189557 A1 | 9/2005 | Mazzochette et al. | |
| 2005/0225222 A1 | 10/2005 | Mazzochette et al. | |

* cited by examiner

LIGHT EMITTING DIODE PACKAGE ASSEMBLY THAT EMULATES THE LIGHT PATTERN PRODUCED BY AN INCANDESCENT FILAMENT BULB

BACKGROUND OF THE INVENTION

Increases in luminous efficiencies and diode luminous intensity have made possible the use light emitting diodes (LEDs) for general lighting and illumination applications. As the efficiency and intensity of high brightness LED devices (HB LEDs) approaches those of incandescent light sources, the packaging of LEDs for general lighting and control of the light radiation patterns and spectral viewing angles becomes increasingly important. In order to replace a tungsten filament bulb, a diode package must facilitate heat dissipation and expand both the luminous viewing angle and the radiation pattern.

Incandescent filament light bulbs emit light at angles in the range 180 to −180 degrees about the bulb. However, basic LEDs emit only a 90 degree cone of light. Various techniques such as diffusion on the LEDs and combining plural LEDs have increased the viewing angle. See for example, U.S. Pat. No. 5,122,781 to Saubolle and U.S. Pat. No. 5,140,220 to Hasegawa. However, these techniques include cumbersome optics and add manufacturing and material costs without achieving the desired 180 to −180 degree viewing angle.

A packaging challenge arises because the package must both conduct heat away from the LEDs and at the same time permit unobstructed emission. While several packaging technologies have been developed for a single LED, most dispose the LED within a cavity and use a reflector cup to guide the light out. Some photons emitted from the side of the LED die strike the cavity walls and never reflect out. Similarly when multiple LEDs are placed adjacent each other on a substrate, photons reflected between adjacent diodes are never recovered. Each LED die is typically a rectangular parallelepiped that emits light from each of its six surfaces. When the LEDs are placed in rows and columns inside a cavity or on a planar conductive substrate, there is a significant photon absorbance and obstruction by the adjacent dies. Accordingly, there remains a need for an LED assembly that can emulate the light distribution created by an incandescent filament bulb.

SUMMARY OF THE INVENTION

In accordance with the invention, a light emitting diode package assembly is provided to emulate the pattern of light produced by an incandescent filament bulb. The package assembly is composed of a substrate for LEDs comprising a heat-sinking base having a pair of opposing major surfaces. Each major surface has overlying islands of electrically insulated but thermally conductive glass islands and an outer surface layer of electrically conductive reflective material. Disposed on each outer surface layer is a plurality of LEDs. The LEDs are arranged on the surface in a configuration of low mutual obstruction. Advantageously, reflecting elements transverse to each surface layer are positioned and shaped to reflect a substantial portion of the light emitted from the LEDs that would otherwise enter neighboring LEDs. In a preferred embodiment, the LEDs are arranged in the general form of a closed curve, and a transverse reflector is disposed in the interior of the curve. Alternatively, the LEDs can be arranged in a linear array. The assembly can be efficiently fabricated by back-to-back assembly of two similar subassemblies.

BRIEF DESCRIPTION OF THE SEVERAL VIEWS OF THE DRAWINGS

The nature, advantages and various additional features of the invention will appear more fully upon consideration of the illustrative embodiments now to be described in detail in connection with the accompanying drawings. In the drawings.

It should be understood that these drawings are to illustrate the concepts of the invention, are not to scale and are not intended to represent all possible embodiments of the invention.

DETAILED DESCRIPTION OF THE INVENTION

Figure 1A:
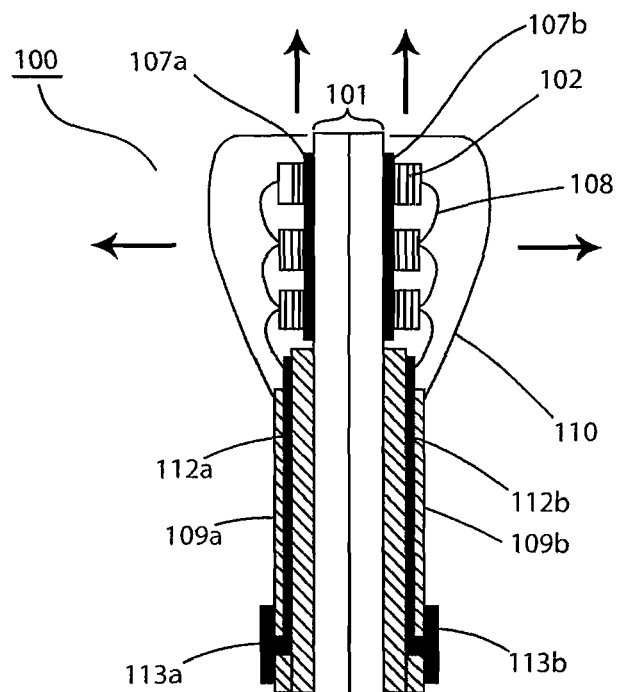
FIGS. 1A and 1B are schematic cross sections of exemplary LED package assemblies for emulating the pattern of light produced by an incandescent filament bulb.
Figure 1B:
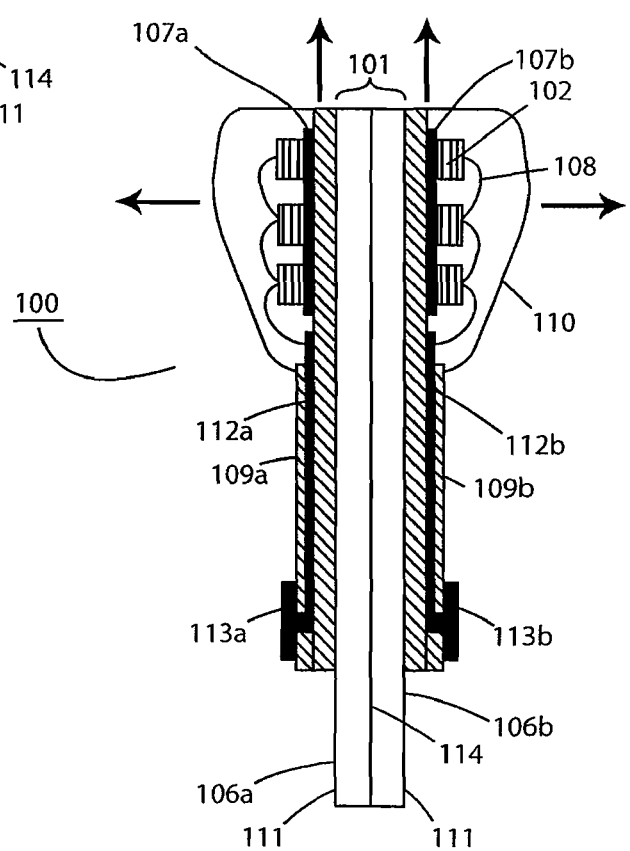

Referring to the drawings, FIGS. 1A and 1B are schematic cross sections of exemplary LED package assemblies 100 for emulating the pattern of light produced by an incandescent filament bulb. The package assembly 100 is composed of a pair of substrates 106A, 106B, each supporting a plurality of LEDs 102. The substrates 106A, 106B are placed in back-to-back adjacency and thermally coupled to form a heat sinking base 101 having a pair of opposing major support surfaces 111. Each of the major surfaces is advantageously composed of an overlying dielectric layer 109 (e.g., a ceramic layer) and an outer surface layer 107A, 107B of light reflecting material such as a specularly reflecting metal film over a glass layer. FIG. 1A shows the outer surface layers 107A, 107B directly overlying the heat sinking base 101, and FIG. 1B shows the outer surface layers 107A, 107B overlying the dielectric layers 109A, 109B, respectively. According to an embodiment of the present invention, the overlying dielectric layer 109 may comprise a high glass transition polymer, such as, for example, polymide. According to another embodiment of the present invention, the overlying dielectric layer 109 may comprise a non-crystallizing glass or a glass ceramic. The two substrates 106A, 106B are advantageously joined together at interface 114 with high thermal conductivity adhesives or solder. The substrates 106A, 106B, the outer surface layers 107A, 107B, and the overlying dielectric layer (i.e., ceramic layer) 109 are advantageously planar.

Disposed overlying each of surfaces 107A, 107B, is a plurality of LEDs 102 (preferably HB LEDs) that are advantageously arranged on the reflective surface layer 107A. 107B in a configuration of low mutual obstruction, i.e. the LED diodes 102 are arranged so that the bulk of the light emitted from the sides of the LEDs 102 does not impinge upon adjacent diodes. (Examples of low obstruction configurations are described in FIGS. 2 and 3 below). Also advantageously, a transverse reflecting element (301 A, B, C of FIG. 3), such as a specularly reflecting cone or drum, is positioned and shaped to reflect a portion of the light emitted from the LEDs 102 that would otherwise impinge on adjacent LEDs. Preferably each light emitting diode 102 emits the light onto the reflecting surface 107A, 107B or away from the surface. One or more electric connections 112A, 112B, 113A, 113B to power the LEDs can be provided overlying or within the ceramic layer 109 and can be connected to the diodes 102 by techniques well known in the art. The diodes 102, leads to the diodes (not shown) and any transverse reflector 301A, B, C can be sealed in a transparent encapsulant 110.

The substrates 106A, 106B may be metal, ceramic, multilayer printed wire board, LTCC, HTCC or any other suitable thermal conductor. They can be electrically insulating or electrically conducting. Advantageously they comprises a highly thermally conductive metal such as copper, tungsten or molybdenum and/or a highly thermally conductive ceramic such as aluminum nitride (ALN), silicon carbide (SiC) or aluminum oxide ($Al_2O_3$). In a preferred embodiment the substrate can be nickel plated copper molybdenum copper clad. Metal powder mixtures are preferred in order to match the thermal expansion coefficient of the LED dies.

The reflective surface layers 107A, 107B cam be coatings of metal such as silver, and the LED dies 102 can be attached to the package by conductive epoxy or AuSn based solder. Conductors can be provided as gold wire or as thick or thin film metal layers.

Advantageously heat sinking base 101 can comprise a composite metal base formed of two metallic substrates 106A, 106B that are adhered together as by adhesive or solder layer 114. According to an embodiment of the present invention, the heat sinking base 101 may comprise a sintered powder metallic mixture, such as, for example, tungsten copper. This design permits fabrication of the package assembly 100 in two subassembly parts using the efficient techniques of conventional surface mount technology (SMT). Specifically, the major surfaces of substrates 106A and 106B can be processed separately, forming the overlying ceramic layers 109A, 109B by LTCC-M technology, applying the reflective surface layers 107A, 107B and applying the LEDs 102, transverse reflector and electronics packages using conventional SMT techniques. The two substrate layers 106A and 106B can then be bonded together, back-to-back to form the packaged assemblies of FIGS. 1A and 1B.

LTCC-M technology involves forming a ceramic layer overlying a metal base using low temperature co-firing. Circuitry can also be incorporated in the process. LTCC-M is described for example, in U.S. Pat. No. 6,455,930 issued Sep. 24, 2002 which is incorporated herein by reference. An LED array package made by LTCC-M is described in U.S. Provisional Application Ser. No. 60/467,857 filed by Joseph Mazzochette and Greg Blonder on May 5, 2003, now U.S. applicaton Ser. No. 10/638,579, filed on Aug. 11, 2003, which are also incorporated by reference.

Figure 2A:
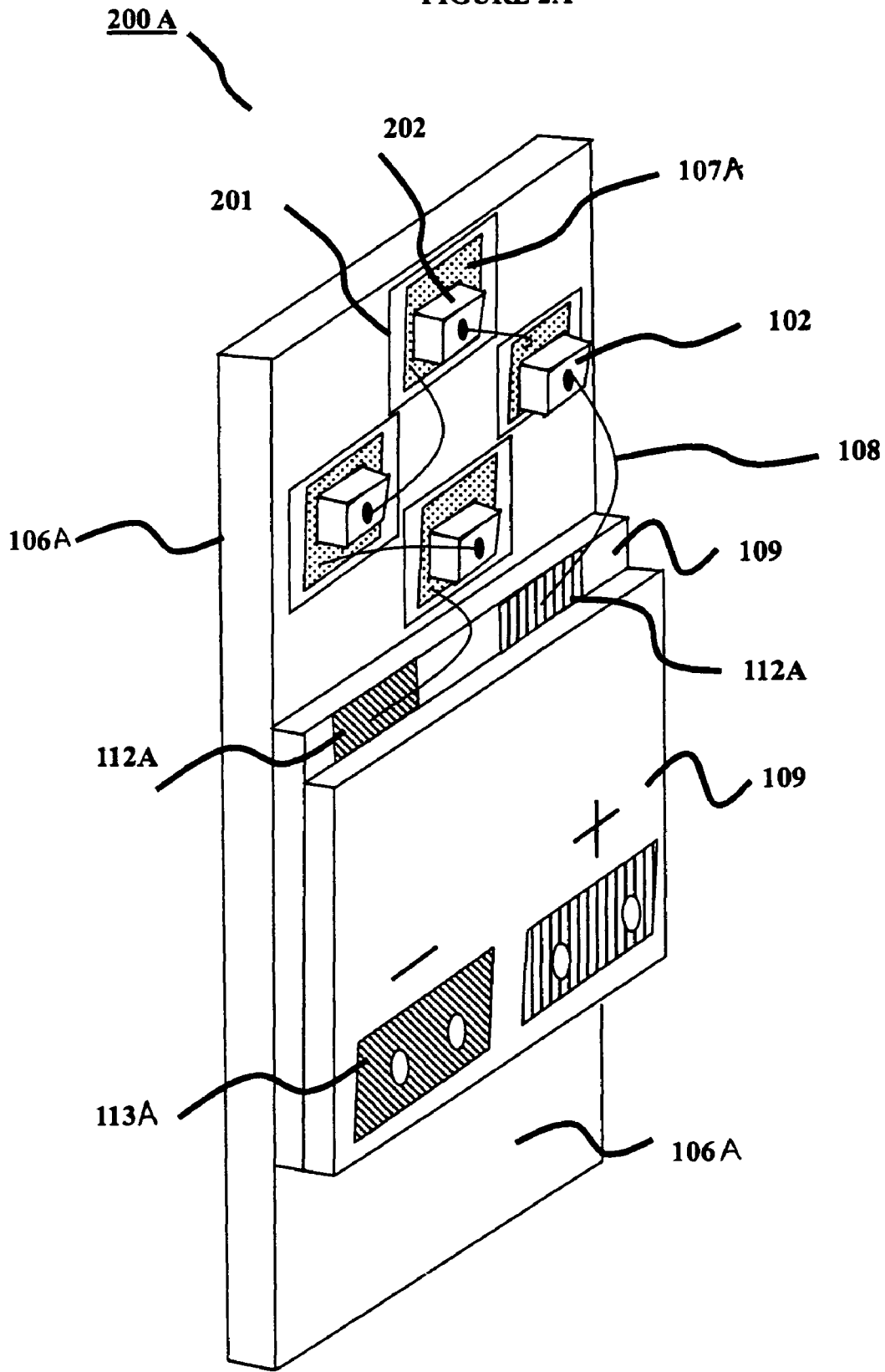
FIGS. 2A and 2B illustrate LED subassemblies useful as independent light sources or as subassemblies in fabricating the package assemblies of FIGS. 1A and 1B.

FIG. 2A illustrates a first example of a subassembly 200A that can be used as an independent light source or as a subassembly in fabricating the assembly package 100 of FIGS. 1A, 1B. The subassembly 200A comprises a layered substrate 106 as described above.

Individual LEDs 102 are attached to conductive layers 107A and nonconductive pads 201 overlying substrate 106A by soldering or by conductive or non-conductive epoxy. Most of the heat generated by the LED during operation is carried away from the diode through the substrate. Accordingly it is desirable for the connection between the LED and the substrate to have high thermal conductivity. Some LEDs are fabricated with both electrodes (anode and cathode) on the top surface. In such cases electrical connections are made from the LED to contacts 112A, on the substrate using wire bonds 108. Other LED fabrications have one electrode on the top face and the second electrode on the bottom. In this second case, the connection between the LED and the substrate serves three purposes, first to mechanically attach the LED die to the substrate, second to provide a thermal path from the die into the substrate, and third as an electrical connection to one of the LED electrodes.

As noted above, the LED package emits light from all sides 202. The dies can be mounted in different configurations. In the preferred configuration shown in FIG. 2A, the dies are arranged in the general form of a closed curve. This arrangement will maximize the light extraction from the dies. The light rays are expelled from the die junctions, and the package thus minimizes mutual obstruction.

Two subassemblies 200A can be mounted back-to-back to create a light distribution pattern that mimics that of an incandescent light bulb. Two subassemblies 200A are place back-to-back with a commonly bonded interface 114 to form an assembly 100. The interface 114 can be glued with silver epoxy or soldered for better thermal transfer or rigidity.

Figure 2B:
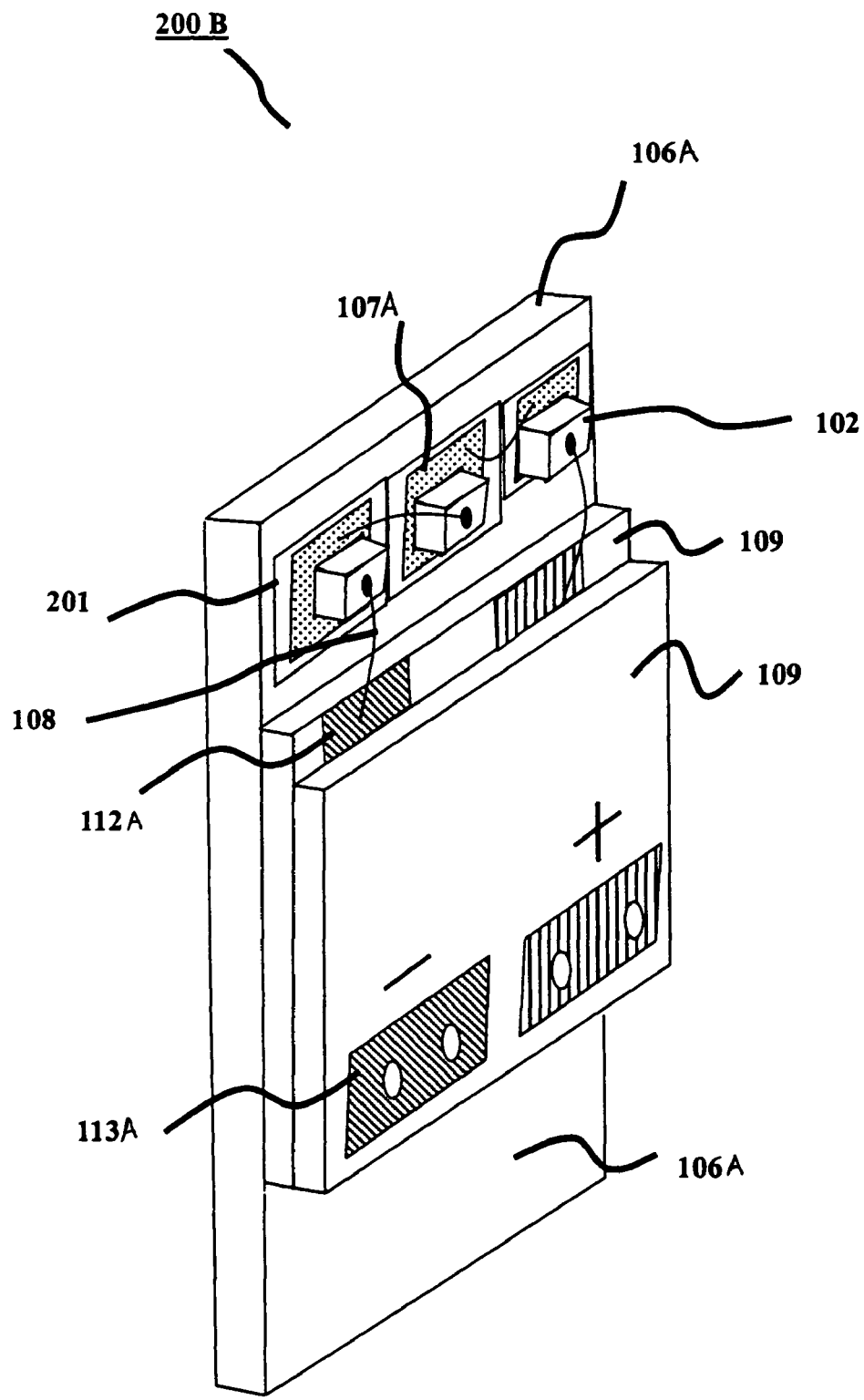

FIG. 2B illustrates an alternative subassembly 200B similar to that of FIG. 2A except that the diodes 102 are arranged in a single linear array. Two subassemblies 200B can be adhered together to form an assembly 100.

Figure 3A:
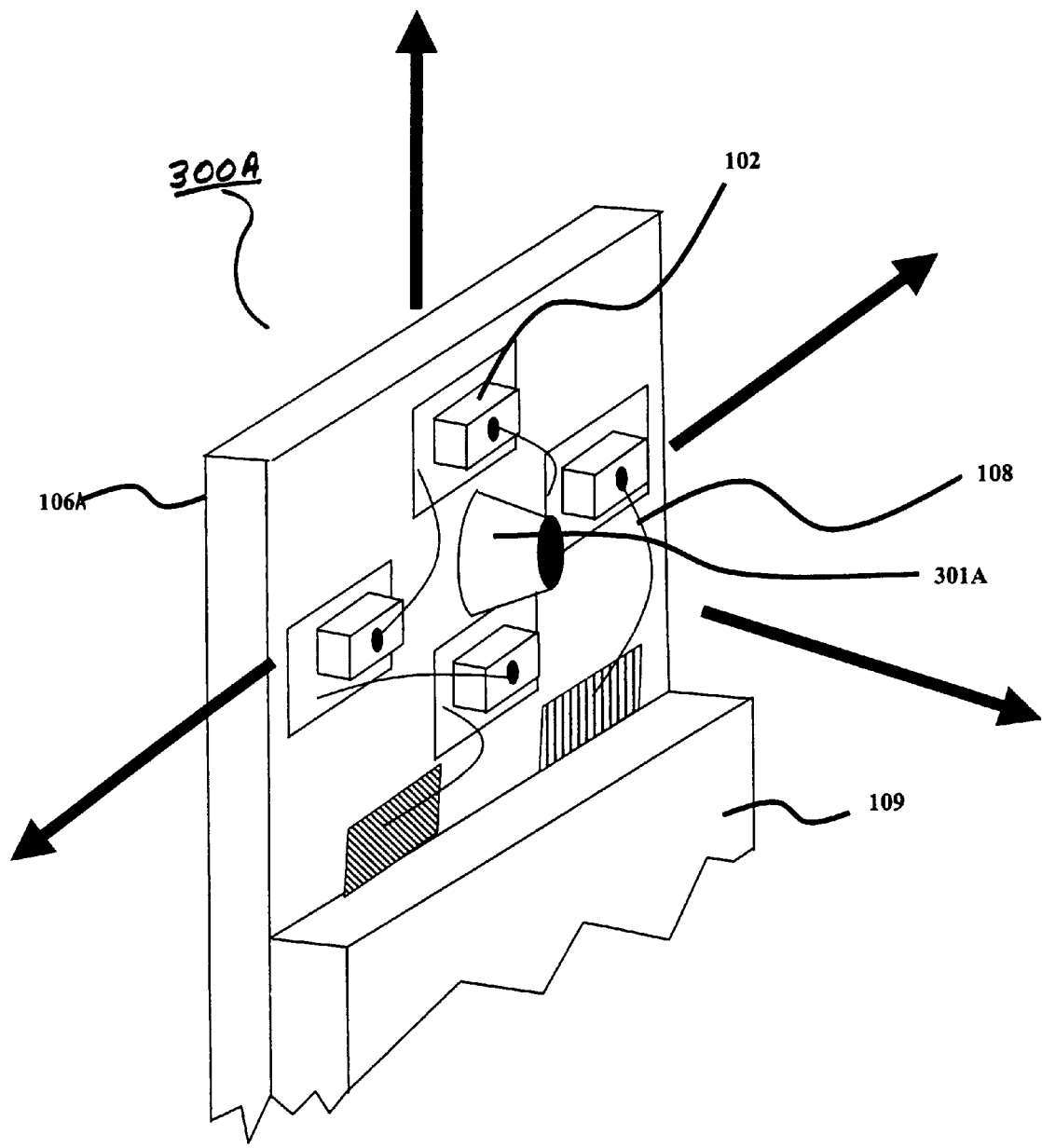
FIGS. 3A, 3B and 3C show additional LED subassemblies that include transverse reflectors.

FIG. 3A shows a subassembly 300A similar to that of FIG. 2A except that in addition to arranging the diodes 102 in the form of a circumscribing closed curve, a transverse reflecting element 301A (here a truncated cone) is disposed in the interior of the circumscribing curve. The element 301A reflects a portion of the diode light that would impinge upon and be absorbed by neighboring diodes.

Figure 3B:
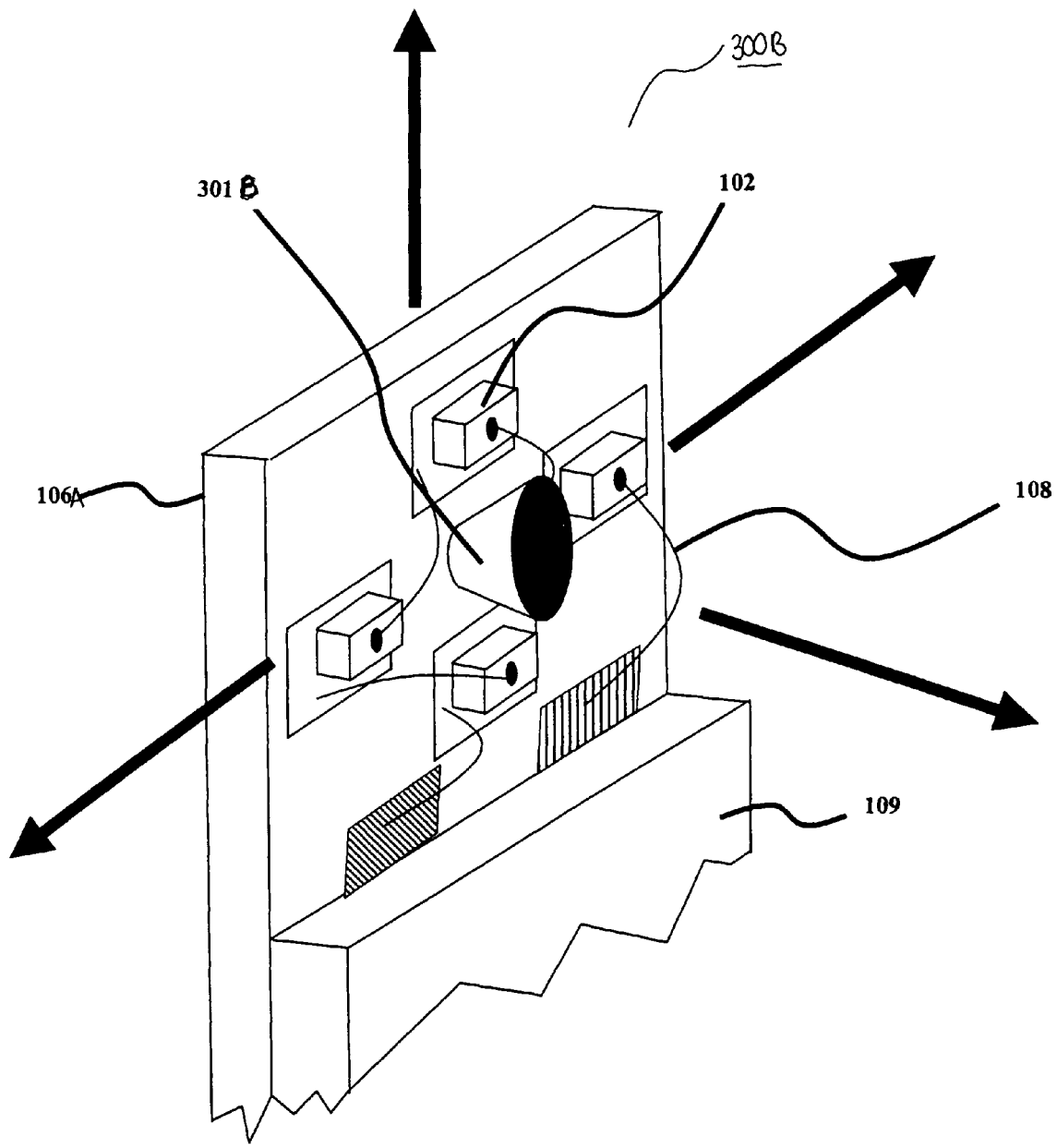
Figure 3C:
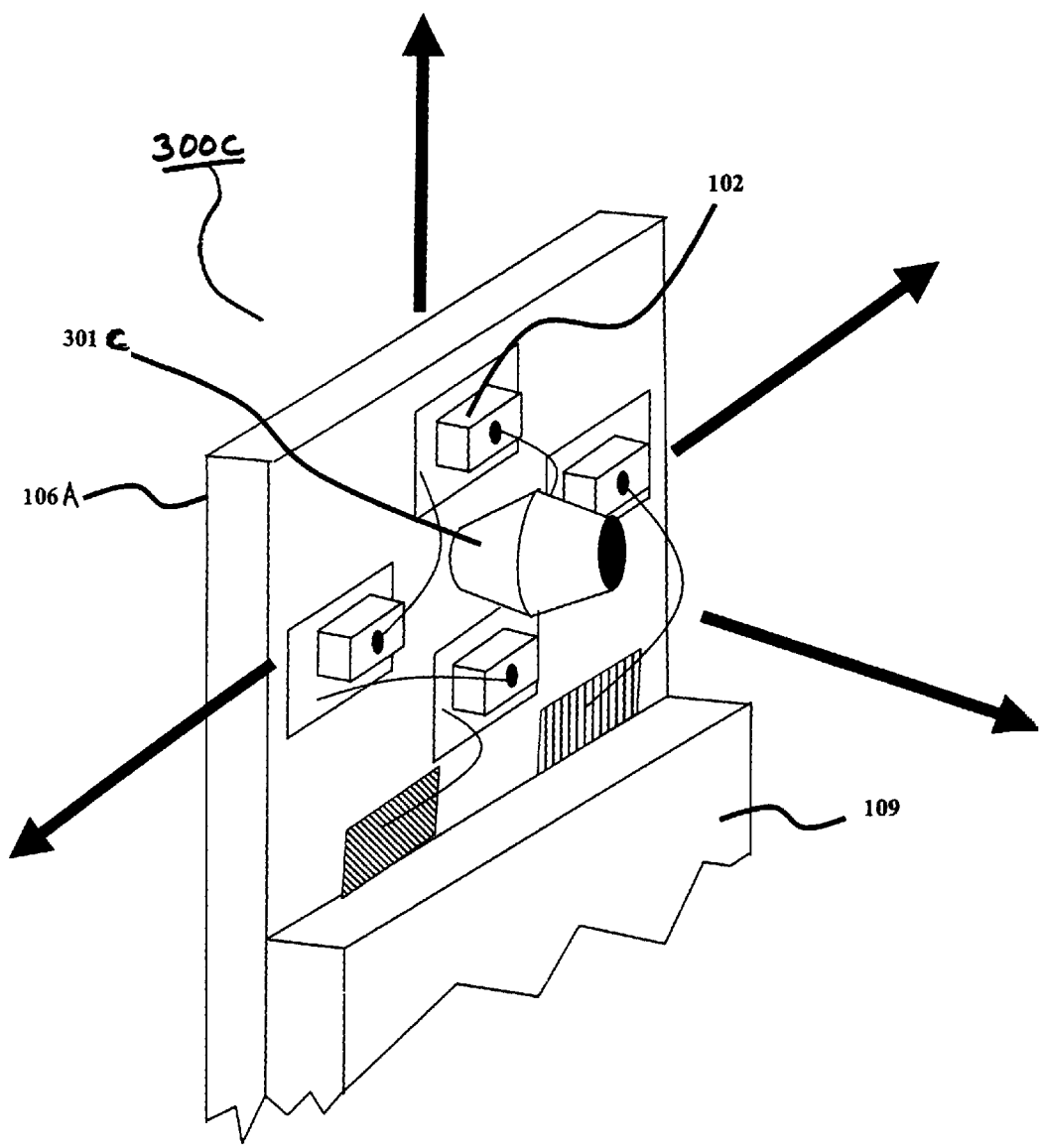

FIG. 3B is a subassembly 300B similar to that of FIG. 3A except that the reflecting element 301B is an inverted, truncated cone; and FIG. 3C has a similar subassembly 300C with a barrel-shaped reflecting element 301C. Two subassemblies 300A, 300B or 300C can be bonded together back-to-back to form an assembly 100.

Figure 4A:
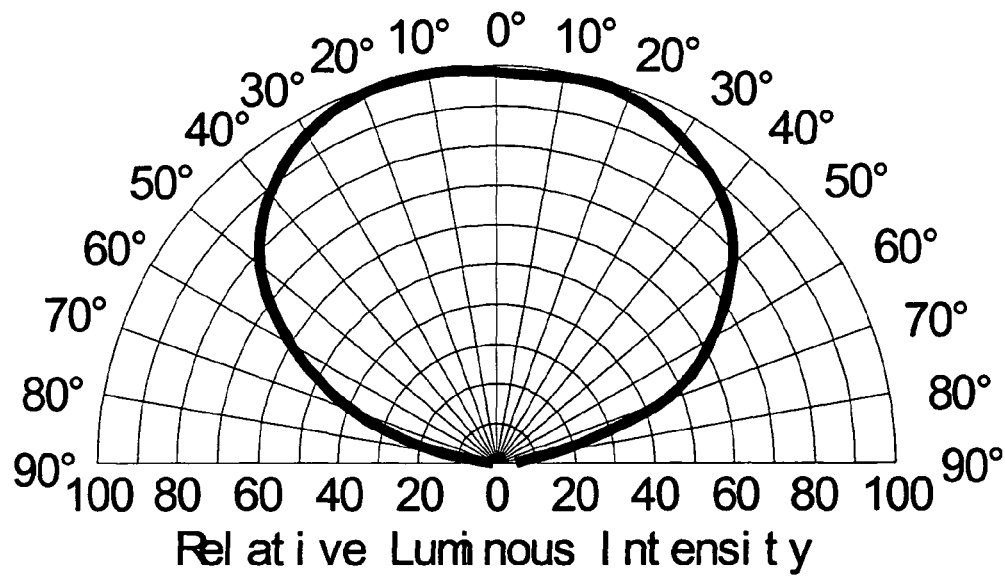
FIG. 4A and 4B are graphical illustrations of light radiation patterns comparing the pattern of a typical inventive assembly with that of a conventional diode.
Figure 4B:
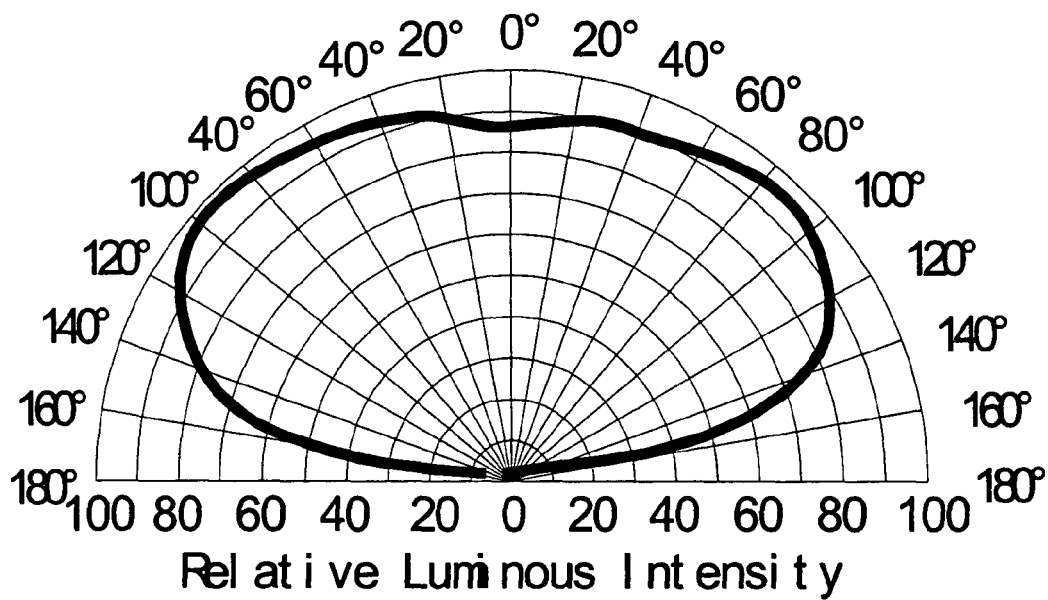

FIG. 4A is a graphical representation of the light pattern generated by conventional planar arrangements of LEDs. FIG. 4B is a similar representation of the light pattern generated by a typical assembly 100 illustrated in FIGS. 1A, 1B. As can be seen, the light pattern closely emulates the 180° to −180° pattern characteristic of an incandescent bulb.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A light emitting diode package assembly for emulating the pattern of light produced by an incandescent filament bulb comprising:

a first subassembly and a second subassembly, each subassembly comprising a substrate having a front surface and a back surface, the substrates being disposed in back-to-back adjacency with a thermally conductive adhesive disposed between the back surfaces to form a heat sinking base having the respective front surfaces opposing each other, each of the front surfaces having an overlying dielectric layer disposed thereon, and each of the overlying dielectric layers having a reflective surface layer formed thereon;

a plurality of LEDs disposed directly on each of the reflective surface layers;

wherein edges of each reflective surface layer extend beyond edges of the LEDs disposed thereon; and a transverse reflecting element disposed on each overlying dielectric layer and configured to reflect a portion of the light emitted by each of the plurality of LEDs, wherein each transverse reflecting element is a cone, a truncated cone, or a barrel formed of two truncated cones.

2. A light emitting diode package assembly according to claim 1 wherein the heat sinking base comprises a metallic layer.

3. A light emitting diode package assembly according to claim 1 wherein the heat sinking base comprises a highly thermally conductive ceramic substrate.

4. A light emitting diode package assembly according to claim 1 wherein the heat sinking base comprises a metallic layer that has a coefficient of thermal expansion matched to the coefficient of thermal expansion of the plurality of LEDs, the metallic layer further comprising two metallic substrates.

5. A light emitting diode package assembly according to claim 4 wherein the metallic substrates include claddings comprising copper/molybdenum/copper.

6. A light emitting diode package assembly according to claim 1 wherein the heat sinking base comprises a sintered powder metallic mixture.

7. A light emitting diode package assembly according to claim 6 wherein the sintered powder metallic mixture comprises tungsten copper.

8. A light emitting diode package assembly according to claim 1 wherein the overlaying dielectric layer comprises a high glass transition polymer.

9. A light emitting diode package assembly according to claim 8 wherein the high glass transition polymer comprises polyimide.

10. A light emitting diode package assembly according to claim 1 wherein each of the overlying dielectric layers is co-fired to the respective front surfaces of the heat sinking base.

11. A light emitting diode package assembly according to claim 1 wherein each reflective surface layer comprises a specularly reflective surface layer.

12. A light emitting diode package assembly according to claim 1 wherein the plurality of LEDs are arranged for low mutual obstruction.

13. A light emitting diode package assembly according to claim 8 wherein the plurality of LEDs on each front surface are arranged in a closed curve.

14. A light emitting diode package assembly according to claim 1 wherein each reflective surface layer is planar.

15. A light emitting diode package assembly according to claim 8 wherein the plurality of LEDs on at least one front surface of the heat sinking base are arranged in a single linear array.

16. A light emitting diode package assembly according to claim 1 further comprising at least one transverse reflecting element to reflect light emitted by at least one of the plurality of LEDs that would otherwise impinge upon one or more neighboring LEDs.

17. A light emitting diode package assembly according to claim 16 wherein the plurality of LEDs are arranged in a closed curve and the transverse reflecting element is disposed in the interior of the closed curve.

18. A light emitting diode (LED) package assembly comprising:
   a first subassembly and a second subassembly, each subassembly comprising a substrate having a front surface and a back surface, the substrates being disposed in back-to-back adjacency and adhered to each other with a thermally conductive adhesive disposed between the back surfaces to form a heat sinking base having the respective front surfaces opposing each other, wherein each of the opposing front surfaces has disposed thereon an overlying dielectric layer comprising a non-crystallizing glass or a glass ceramic having a thermal coefficient of expansion matched to the thermal coefficient of expansion of the heat sinking base, and each overlying dielectric layer having a reflective surface layer formed thereon;
   a plurality of LEDs disposed directly on each of the reflective surface layers wherein edges of each reflective surface layer extend beyond edges of the LEDs disposed thereon;
   a transverse reflecting element disposed on each overlying dielectric layer and configured to reflect a portion of the light emitted by each of the plurality of LEDs, wherein each transverse reflecting element is a cone, a truncated cone, or a barrel formed of two truncated cones.

19. A light emitting diode package assembly according to claim 18 wherein the plurality of LEDs are arranged in a closed curve.

20. A light emitting diode package assembly according to claim 19 further comprising a reflecting element in the interior of the closed curve, the reflecting element shaped to reflect light emitted from the LEDs at an angle away from the reflective surface layer.

21. A light emitting diode package assembly according to claim 19 wherein each reflective surface layer comprises a specular material.

22. A light emitting diode package assembly according to claim 21 wherein the specular material comprises a metal film.

23. A light emitting diode package assembly according to claim 21 wherein the specular material comprises a thin metal film.

24. A light emitting diode package assembly for emulating the pattern of light produced by an incandescent filament bulb, comprising:
   a first subassembly and a second subassembly, each subassembly comprising a substrate having a front surface and a back surface, each front surface having an overlying dielectric layer disposed thereon, each overlying dielectric layer having a reflective surface layer formed thereon, and each reflective surface layer having more than one LED disposed directly thereon;
   wherein the first subassembly and the second subassembly are disposed in back-to-back adjacency with a thermally conductive adhesive disposed between the back surfaces to form a heat sinking base having the respective front surfaces facing away from each other; and
   a transverse reflecting element disposed on each overlying dielectric layer and configured to reflect a portion of the light emitted by each of the plurality of LEDs, wherein each transverse reflecting element is a cone, a truncated cone, or a barrel formed of two truncated cones.

25. The light emitting diode package assembly according to claim 24, wherein each substrate comprises a metallic layer having a coefficient of thermal expansion matched to a coefficient of thermal expansion of the respective LED.

* * * * *